(12) United States Patent
Chiu et al.

(10) Patent No.: US 11,532,568 B2
(45) Date of Patent: Dec. 20, 2022

(54) ELECTRONIC PACKAGE

(71) Applicant: SILICONWARE PRECISION INDUSTRIES CO., LTD., Taichung (TW)

(72) Inventors: Chih-Hsien Chiu, Taichung (TW); Wen-Jung Tsai, Taichung (TW); Yu-Wei Yeh, Taichung (TW); Tsung-Hsien Tsai, Taichung (TW); Chi-Liang Shih, Taichung (TW); Sheng-Ming Yang, Taichung (TW); Ping-Hung Liao, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 44 days.

(21) Appl. No.: 16/931,180

(22) Filed: Jul. 16, 2020

(65) Prior Publication Data
US 2021/0375783 A1 Dec. 2, 2021

(30) Foreign Application Priority Data
May 29, 2020 (TW) ................................. 109118096

(51) Int. Cl.
*H01L 23/552* (2006.01)
*H01L 23/00* (2006.01)
*H01L 23/31* (2006.01)
*H01L 23/498* (2006.01)

(52) U.S. Cl.
CPC ........ *H01L 23/552* (2013.01); *H01L 23/3121* (2013.01); *H01L 23/49838* (2013.01); *H01L 24/32* (2013.01); *H01L 24/48* (2013.01); *H01L 24/73* (2013.01); *H01L 2224/32225* (2013.01); *H01L 2224/48091* (2013.01); *H01L 2224/48227* (2013.01); *H01L 2224/48465* (2013.01); *H01L 2224/48599* (2013.01); *H01L 2224/73265* (2013.01); *H01L 2924/3025* (2013.01)

(58) Field of Classification Search
CPC .............................. H01L 23/552; H01L 24/49
See application file for complete search history.

(56) References Cited

U.S. PATENT DOCUMENTS

| 8,012,868 B1 * | 9/2011 | Naval | H01L 23/552 |
| | | | 438/617 |
| 10,141,269 B2 * | 11/2018 | Jeon | H01L 23/552 |
| 11,342,276 B2 * | 5/2022 | Chung | H01L 23/5384 |

(Continued)

FOREIGN PATENT DOCUMENTS

| JP | 2014107486 A * | 6/2014 | ............. H01L 24/48 |

OTHER PUBLICATIONS

Definition of "line", http://www.dictionary.com (2021) (Year: 2021).*

(Continued)

*Primary Examiner* — Michele Fan
(74) *Attorney, Agent, or Firm* — Kelly & Kelley, LLP

(57) ABSTRACT

An electronic package is provided and uses a plurality of bonding wires as a shielding structure. The bonding wires are stitch bonded onto a carrier carrying electronic components, such that the problem of the shielding structure peeling off or falling off from the carrier can be avoided due to the fact that the bonding wires are not affected by temperature, humidity and other environmental factors.

6 Claims, 9 Drawing Sheets

(56) References Cited

U.S. PATENT DOCUMENTS

| | | | | |
|---|---|---|---|---|
| 2007/0158392 A1* | 7/2007 | Shimanuki | ............ | H01L 24/48 |
| | | | | 228/101 |
| 2007/0241440 A1* | 10/2007 | Hoang | ............ | H01L 21/52 |
| | | | | 257/685 |
| 2008/0014678 A1* | 1/2008 | Howard | ............ | H01L 24/85 |
| | | | | 438/106 |
| 2008/0310114 A1* | 12/2008 | Pawlenko | ............ | H05K 7/20454 |
| | | | | 361/704 |
| 2010/0314748 A1* | 12/2010 | Hsu | ............ | H01L 23/3128 |
| | | | | 257/693 |
| 2011/0084378 A1* | 4/2011 | Welch | ............ | H01L 23/3121 |
| | | | | 257/692 |
| 2012/0061816 A1* | 3/2012 | Song | ............ | H01L 23/3677 |
| | | | | 257/E23.079 |
| 2013/0093088 A1* | 4/2013 | Chau | ............ | H01L 21/4853 |
| | | | | 257/784 |
| 2014/0002188 A1* | 1/2014 | Chen | ............ | H03F 3/21 |
| | | | | 330/250 |
| 2014/0016277 A1* | 1/2014 | Chen | ............ | H01L 21/561 |
| | | | | 361/728 |
| 2014/0308907 A1* | 10/2014 | Chen | ............ | H01L 21/76877 |
| | | | | 455/90.3 |
| 2017/0117229 A1* | 4/2017 | Kumbhat | ............ | H01L 21/561 |
| 2018/0098418 A1* | 4/2018 | Lee | ............ | H05K 1/023 |
| 2018/0166363 A1* | 6/2018 | Heppner | ............ | H01L 23/481 |
| 2018/0254249 A1* | 9/2018 | Lee | ............ | H01L 23/3121 |
| 2018/0374798 A1* | 12/2018 | Lee | ............ | H01L 21/486 |
| 2019/0181098 A1* | 6/2019 | Lee | ............ | H01L 25/0655 |

OTHER PUBLICATIONS

Definition of "line", http://www.merriam-webster.com (2021) (Year: 2021).*

* cited by examiner

ELECTRONIC PACKAGE

BACKGROUND

1. Technical Field

The present disclosure relates to a semiconductor packaging process, and more particularly, to an electronic package with a shielding structure.

2. Description of Related Art

With the rapid growths in the electronic industry, high integration (e.g., compact, light, thin, etc.) is one of the goals for many high-end electronic products. The advancements in packaging technology have brought about a myriad of chip packaging techniques as well as semiconductor packages with ever smaller sizes or volumes to meet the goals of compact, thin, light semiconductor packages.

In order to satisfy these goals, packages are disposed more densely on the electronic products. However, this may lead to electromagnetic interference (EMI) between the packages.

In order to address the EMI issue between the various electronic packages, an outer shield is usually disposed during the packaging process of a package to avoid the EMI between various packages.

As shown in FIG. 1, a conventional semiconductor package 1 includes at least one semiconductor component 11, 11' disposed on a package substrate 10. The semiconductor components 11, 11' are then encapsulated by an encapsulant 13. Thereafter, a shield 12 is bonded onto the package substrate 10 via a conductive adhesive 120, so that the semiconductor components 11, 11' can be covered by the shield 12.

However, in the conventional semiconductor package 1, the adhesiveness of the conductive adhesive 120 may be degraded due to temperature, humidity or other environmental factors, and the shield 12 may easily peel off or fall off from the package substrate 10.

Furthermore, when the shield 12 is secured on the encapsulant 13, the size and shape of the shield 12 has to conform with the size and shape of the encapsulant 13 with high accuracy. As a result, there needs to be a certain level of accuracy in the relative positions of the shield 12 and the encapsulant 13 during the manufacturing process. This leads to higher cost and longer manufacturing time.

In addition, since the sizes and the shapes of the shield 12 and the encapsulant 13 have to match, if semiconductor components 11, 11' of different sizes and shapes are present, then a new shield of a different size and shape may be needed. In this case, a new mold needs to be made to produce an encapsulant 13 of a different size and shape, thus increasing manufacturing cost and time.

Therefore, there is a need for a solution that addresses the aforementioned issues in the prior art.

SUMMARY

In view of the aforementioned shortcomings of the prior art, the present disclosure provides an electronic package, which may comprise: a carrier; an electronic component disposed on the carrier; and a shielding structure including a plurality of bonding wire portions, each of the bonding wire portions being provided on the carrier by continuous wire bonding, wherein the bonding wire portion has an arc line shape and is defined with a first line segment, a second line segment and a curved segment connected with the first and second line segments.

In the aforementioned electronic package, a length of the first line segment and a length of the second line segment are not equal.

In the aforementioned electronic package, the bonding wire portion is a single line segment.

In the aforementioned electronic package, the shielding structure forms a closed loop.

The aforementioned electronic package may further include a packaging layer encapsulating the electronic component and the shielding structure. For example, the shielding structure is partially exposed from the packaging layer. The aforementioned electronic package may further include a shielding layer formed on the packaging layer. Furthermore, the shielding layer is electrically connected with the carrier. The shielding layer is in contact with the shielding structure. Alternatively, the shielding layer is not in contact with the shielding structure.

In the aforementioned electronic package, all of the plurality of bonding wire portions are continuously wire bonded to integrally form the shielding structure.

In the aforementioned electronic package, the wire bonding between two adjacent ones of the plurality of bonding wire portions is interrupted to form a plurality of discontinuous segments of the shielding structure.

The present disclosure further provides an electronic package, which may include: a carrier; an electronic component disposed on the carrier; and a shielding structure including a plurality of bonding wire portions, each of the bonding wire portions being provided on the carrier by continuous wire bonding, wherein the bonding wire portion has a first bonding wire and a second bonding wire, the first bonding wire is in an arc line shape and one end of the first bonding wire is disposed correspondingly with the second bonding wire, and the second bonding wire is a single line segment and disposed on the carrier.

In the aforementioned electronic package, a height of the first bonding wire relative to the carrier is lower than a height of the second bonding wire relative to the carrier.

In the aforementioned electronic package, the first bonding wire is defined with a first line segment, a second line segment and a curved segment connected with the first and second line segments.

In the aforementioned electronic package, the second bonding wire has one end bonded to a location to which the first bonding wire is connected.

The aforementioned electronic package may further include a packaging layer encapsulating the electronic component and the shielding structure. For example, the shielding structure is partially exposed from the packaging layer. The aforementioned electronic package may further include a shielding layer formed on the packaging layer. Furthermore, the shielding layer is electrically connected with the carrier. The shielding layer is in contact with the shielding structure. Alternatively, the shielding layer is not in contact with the shielding structure.

As can be seen from the above, the electronic package of the present disclosure employs the bonding wire portions bonded on the carrier as the shielding structure to prevent the influences of temperature, humidity and other environmental factors. Thus, compared to the prior art, the electronic package of the present disclosure effectively prevents the shielding structure from peeling off or falling off from the carrier.

BRIEF DESCRIPTION OF THE DRAWINGS

FIG. 2A' is a schematic cross-sectional view of the electronic package in accordance with the first embodiment of the present disclosure taken from one perspective.

FIG. 3A' is a schematic cross-sectional view depicting another aspect of FIG. 3A.

DETAILED DESCRIPTION

Figure 1:
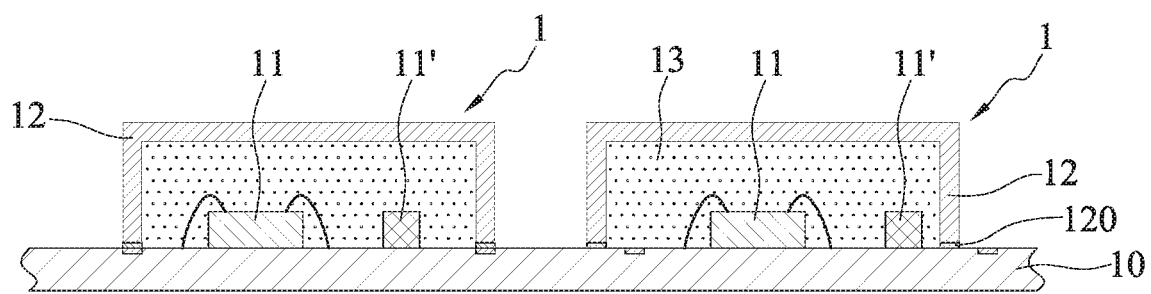
FIG. 1 is a schematic cross-sectional view of a conventional semiconductor package.

The implementations of present disclosure are illustrated using the following embodiments. One of ordinary skill in the art can readily appreciate the other advantages and technical effects of the present disclosure upon reading the disclosure of this specification.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "first," "second," "above," "a," "an," and the like, are for illustrative purposes, and are not meant to limit the range in which the present disclosure can be implemented. Any variations or modifications made to their relative relationships, without changing the substantial technical contents, are also to be construed as within the range in which the present disclosure can be implemented.

Figure 2A:
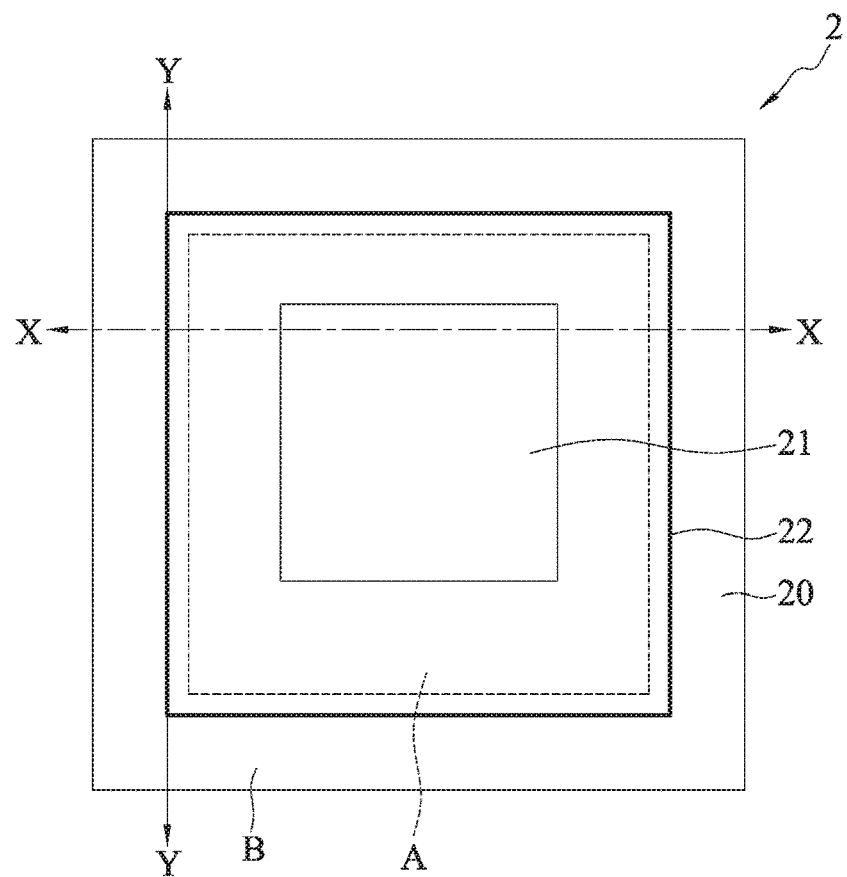
FIG. 2A is a schematic top view of an electronic package in accordance with a first embodiment of the present disclosure.
Figure 2A:
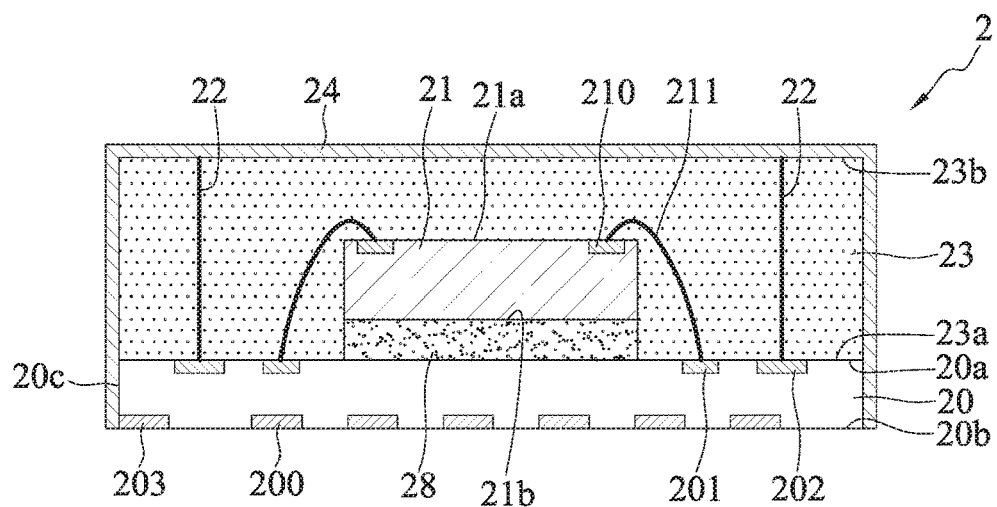

FIG. 2A is a schematic top view depicting an electronic package 2 in accordance with a first embodiment the present disclosure. The electronic package 2 includes a carrier 20, at least one electronic component 21 disposed on the carrier 20, and a shielding structure 22 disposed on the carrier 20 and shielding around the periphery of the electronic component 21.

In an embodiment, as shown in FIG. 2A', the electronic package 2 further includes a packaging layer 23 covering the electronic component 21 and the shielding structure 22, and a shielding layer 24 disposed on the packaging layer 23.

The carrier 20 includes a first side 20a and a second side 20b opposite to each other, and a chip placement area A and a periphery area B surrounding the chip placement area A are defined on the first side 20a.

In an embodiment, the carrier 20 is a package substrate with a core layer and a circuit structure or a coreless circuit structure. The circuit structure forms a circuit layer 200, such as a fan-out redistribution layer (RDL) on a dielectric material. The dielectric material can be polybenzoxazole (PBO), polyimide (PI), a prepreg (PP), etc. It can be appreciated that the carrier 20 can also be other types of carrier units for carrying electronic components (e.g., chips), such as a lead-frame, a silicon interposer or the like, and the present disclosure is not limited as such.

Moreover, the circuit layer 200 includes a plurality of electrical contact pads 201 disposed on the chip placement area A and at least one optional function pad 202 disposed on the periphery area B.

Figure 3A:
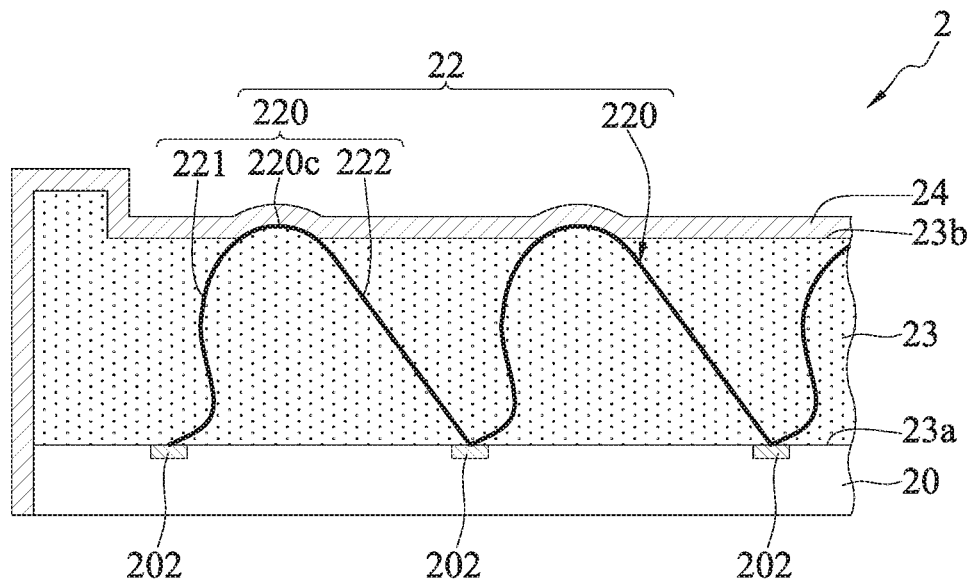
FIG. 3A is a schematic cross-sectional view of the electronic package in accordance with the first embodiment of the present disclosure taken from another perspective.
Figure 3A:
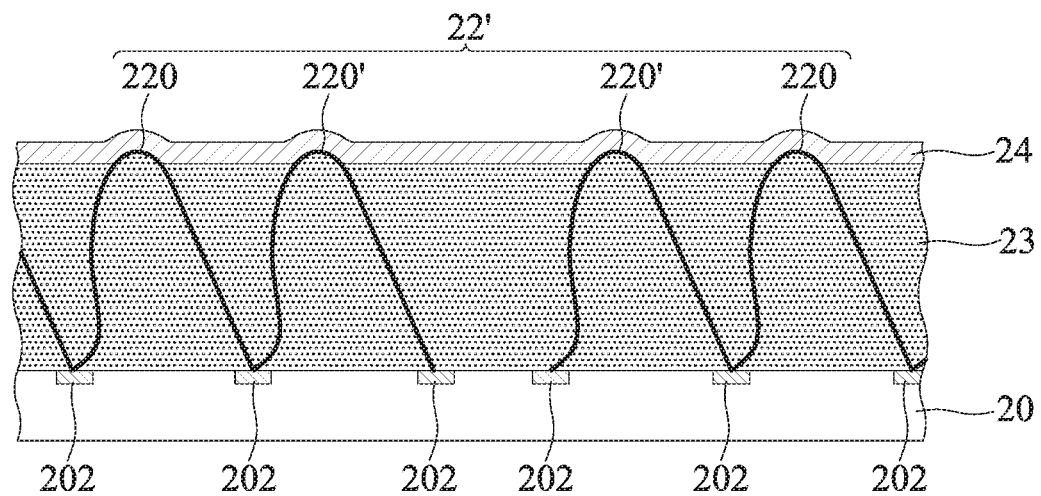

In addition, the enlarged cross-sectional structure shown in FIG. 2A' is a cross-sectional view of the structure shown in FIG. 2A cut along line X-X, and the locally enlarged cross-sectional structure shown in FIG. 3A is a cross-sectional view of the structure shown in FIG. 2A cut along line Y-Y.

The electronic component 21 is disposed on the chip placement area A of the first side 20a of the carrier 20.

In an embodiment, the electronic component 21 may be an active component, a passive component, or a combination of both. The active component can be, for example, a semiconductor chip, and the passive component can be, for example, a resistor, a capacitor or an inductor. For example, the electronic component 21 is a semiconductor chip with an active face 21a and a non-active face 21b opposite to the active face 21a. The electronic component 21, via its non-active face 21b, is disposed on the first side 20a of the carrier 20 through an adhesive 28. The active face 21a includes a plurality of electrode pads 210 that are electrically connected to the electrical contact pads 201 via a plurality of wires 211 by wire bonding. Alternatively, the electronic component 21 can be electrically connected to the electrical contact pads 201 of the carrier 20 through a plurality of conductive bumps (not shown) in a flip-chip manner and the conductive bumps are encapsulated by an underfill (not shown). Alternatively, the electrode pads 210 of the electronic component 21 can directly come into contact with the electrical contact pads 201 to electrically connect with the circuit layer 200. However, it can be appreciated that the way in which the electronic component 21 is electrically connected with the carrier 20 is not limited to those described above.

The shielding structure 22 includes a plurality of bonding wire portions 220 (as shown in FIG. 3A), and the plurality of bonding wire portions 220 are placed on the periphery area B of the first side 20a of the carrier 20.

In an embodiment, the bonding wire portions 220 are bonded onto the function pads 202 of the carrier 20, such that the bonding wire portions 220 are electrically connected with the carrier 20. For example, the bonding wire portions 220 are metal wires used for wire bonding. Each of the two ends of a bonding wire portion 220 is bonded to a function pad 202 of the carrier 20 as shown in FIG. 3A.

Moreover, as shown in FIG. 3A, each of the bonding wire portions 220 of the shielding structure 22 is formed by continuous wire bonding in the shape of an arc or an closed arc loop, for example. A single bonding wire portion 220 is defined with a first line segment 221, a second line segment 222 and a curved segment 220c connecting the first line segment 221 and the second line segment 222. As an example, the first line segment 221 and the second line segment 222 have different lengths. In an embodiment, the length of the first line segment 221 is shorter than that of the second line segment 222.

Figure 2B:
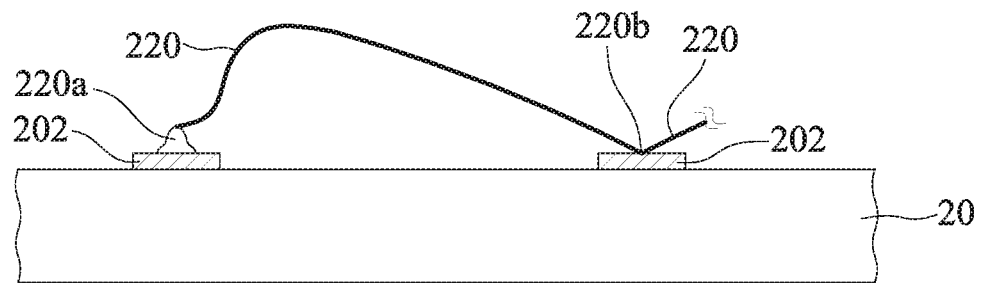
FIG. 2B is a schematic side view depicting the manufacturing of a shielding structure in FIG. 2A.
Figure 2C:
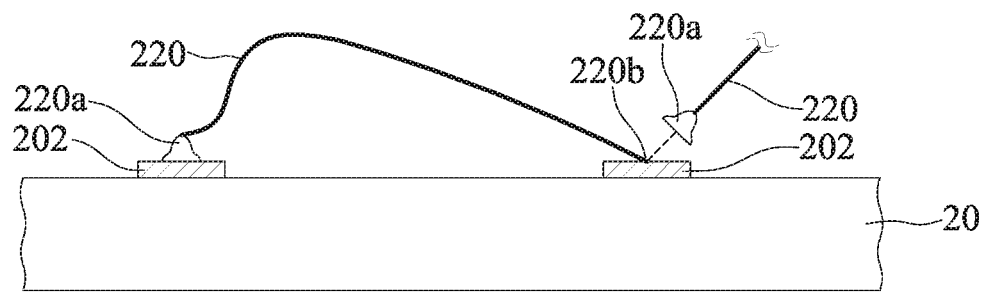
FIG. 2C is a schematic diagram depicting another aspect of FIG. 2B.

Furthermore, continuous wire bonding of the shielding structure 22 involves, for example, pulling a gold wire from a function pad 202 to another function pad 202 by a nozzle (not shown) of a wire bonding machine (not shown) and stitch bonding the gold wire before cutting off as shown in FIG. 2B. Then, another gold wire is pulled from the cut-off location 220b by the nozzle. Alternatively, as shown in FIG. 2C, after cutting off, a ball 220a is formed at the cut-off location 220b by the nozzle before pulling another gold wire.

In addition, the plurality of bonding wire portions 220 can be continuously wire bonded if needed, so that the shielding structure 22 is integrally formed (as shown in FIG. 3A). Alternatively, as shown in FIG. 3A', wire bonding between any two adjacent bonding wire portions 220 can be interrupted, so that the shielding structure 22' is in the form of discontinuous segments.

The packaging layer 23 is disposed on the first side 20a of the carrier 20 to encapsulate the electronic component 21 and the shielding structure 22.

In an embodiment, the packaging layer 23 can be made from an insulating material, for example, polyimide, a dry film, an epoxy resin, or a molding compound. For example, the packaging layer 23 can be formed on the first side 20a of the carrier 20 by liquid compound encapsulation, injection, lamination, compression molding, and the like.

Moreover, the packaging layer 23 is defined with a first surface 23a and a second surface 23b opposite to each other. The packaging layer 23 is bonded onto the first side 20a of the carrier 20 via its first surface 23a. Therefore, the bonding wire portions 220 can be exposed from the second surface 23b of the packaging layer 23 if needed, as shown in FIG. 3A. For example, a portion of the second surface 23b of the packaging layer 23 can be removed, such that the curved segment 220c of a bonding wire portion 220 can protrude out of the second surface 23b of the packaging layer 23, such that the curved segment 220c is exposed from the second surface 23b of the packaging layer 23. Alternatively, the bonding wire portion 220 can be not exposed from the packaging layer 23 as shown in an electronic package 2' in accordance with a second embodiment of the present disclosure in FIG. 3B.

Figure 3B:
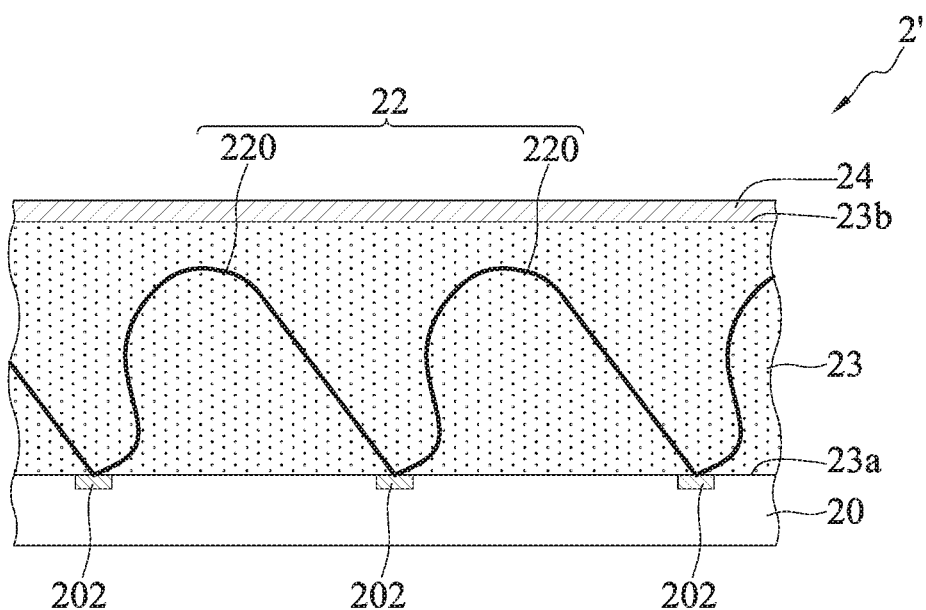
FIG. 3B is a schematic cross-sectional view of an electronic package in accordance with a second embodiment of the present disclosure.
Figure 3C:
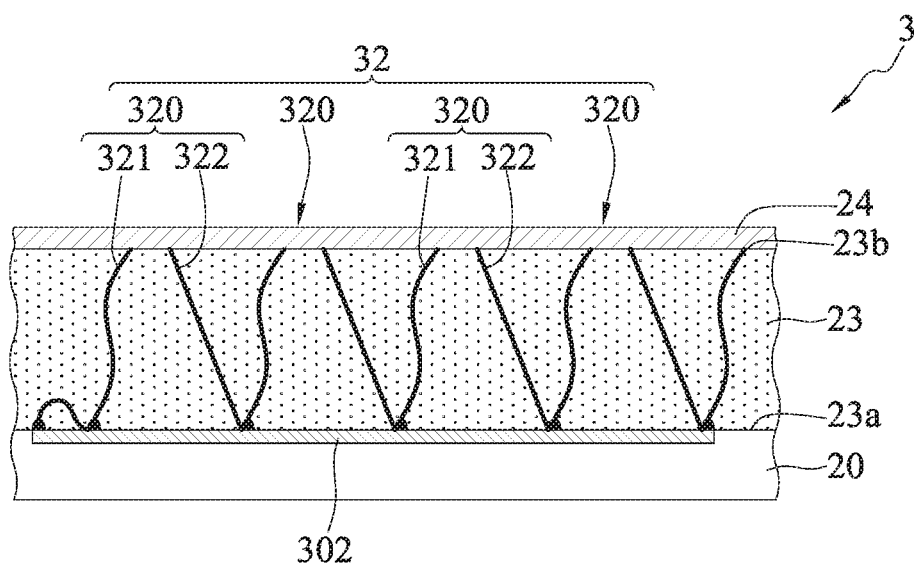
FIG. 3C is a schematic cross-sectional view of an electronic package in accordance with a third embodiment of the present disclosure.

Furthermore, in an electronic package 3 in accordance with a third embodiment of the present disclosure shown in FIG. 3C, during the removal process, a portion of the second surface 23b of the packaging layer 23 as well as the curved segment 220c of the bonding wire portions 220 are removed, such that first line segments 321 and second line segments 322 of the bonding wire portions 320 are separated and used as the shielding structure 32, and the ends of the first line segments 321 and the ends of the second line segments 322 are exposed from the second surface 23b of the packaging layer 23, wherein the bonding wire portions 320 are formed on the same function pad 302.

Figure 4A:
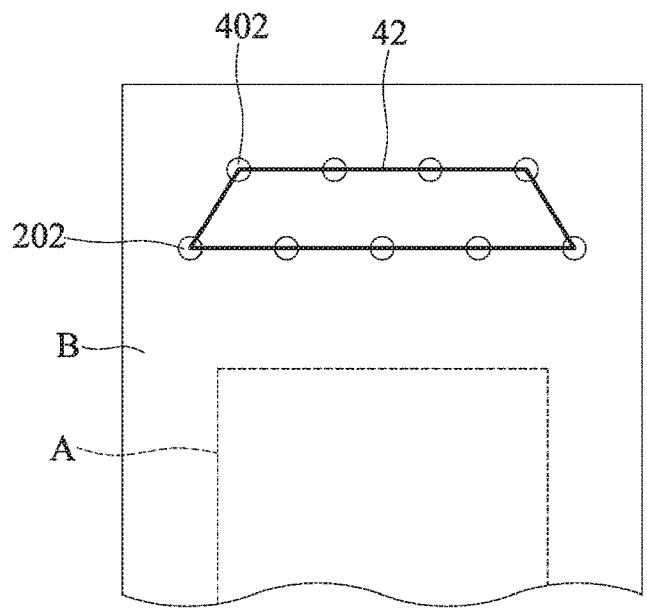
FIG. 4A is a partial schematic top view of an electronic package in accordance with a fourth embodiment of the present disclosure.
Figure 4B:
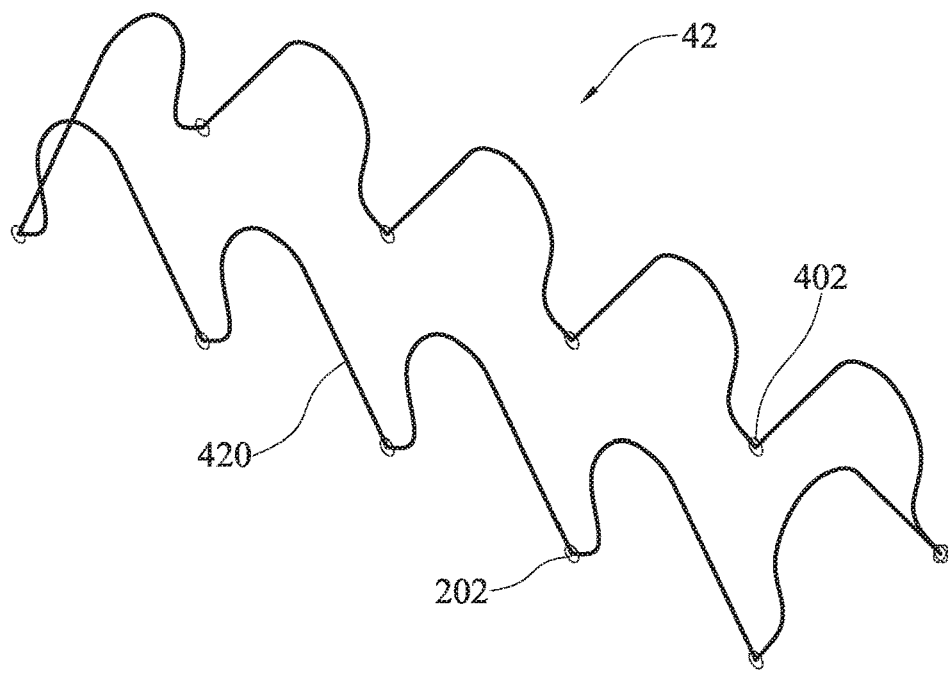
FIG. 4B is a partial perspective view of FIG. 4A.
Figure 4C:
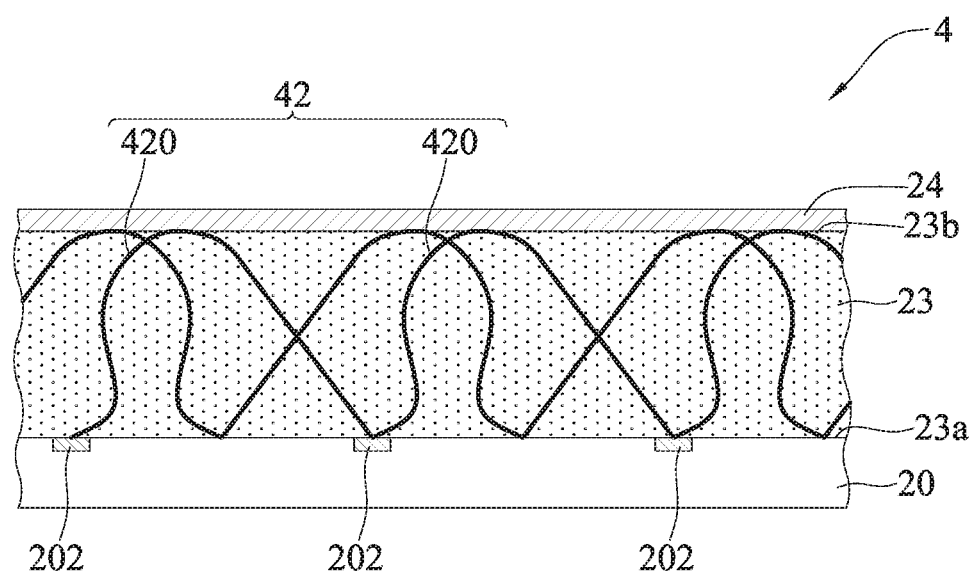
FIGS. 4C and 4C' are schematic cross-sectional views of different aspects of FIG. 4A.
Figure 4C:
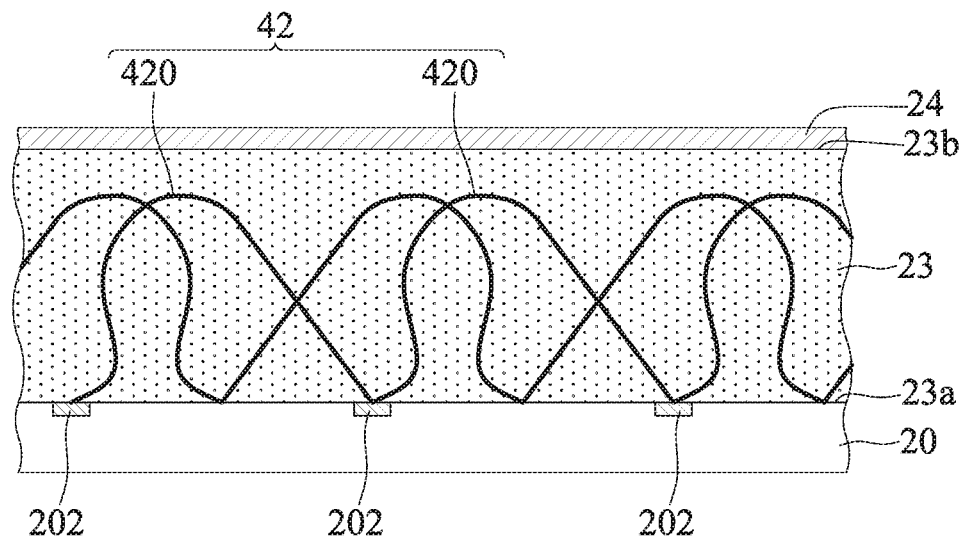

In addition, the periphery area B of the carrier 20 can be provided with a plurality of function pads 202, 402 if needed, so that a shielding structure 42 forms a closed loop, as shown in an electronic package 4 in accordance with a fourth embodiment of the present disclosure in FIG. 4A. As an example, bonding wire portions 220 based on FIG. 3A or 3B can form the closed-loop shielding structure 42 by continuous wire bonding on the periphery area B on at least one side of the chip placement area A, as shown in FIG. 4B, wherein the bonding wire portions 420 can be exposed from the second surface 23b of the packaging layer 23 (as shown in FIG. 4C) or not exposed from the second surface 23b of the packaging layer 23 (as shown in FIG. 4C'). In an embodiment, the bonding wire portions 420 are arranged in two crisscross rows and weaved into a fence or a mesh to provide better shielding.

The shielding layer 24 is formed on the second surface 23b of the packaging layer 23 and electrically connected to the circuit layer 200 of the carrier 20.

In an embodiment, the shielding layer 24 can be made of a conductive material or other suitable shielding material, and can be formed on the second surface 23b of the packaging layer 23 by sputtering or other methods. It can be appreciated that there are numerous constructions of the shielding layer 24 and numerous ways of producing them, and there is no special restrictions.

Moreover, the shielding layer 24 is in contact with the shielding structure 22, 32, 42 (e.g., the bonding wire portions 220, 320, 420 shown in FIG. 3A, 3C or 4C) to indirectly electrically connect with the circuit layer 200 of the carrier 20. In other embodiments, if the shielding structure 22, 42 is not exposed from the packaging layer 23 (e.g., the bonding wire portions 220, 420 shown in FIG. 3B or 4C'), the shielding layer 24 can extend to where the carrier 20 is exposed (e.g., a side 20c of the carrier 20) to make contact with a grounded portion 203 of the circuit layer 200, such that the shielding layer 24 is directly electrically connected with the circuit layer 200 of the carrier 20.

It can be appreciated that there are numerous ways in which the shielding layer 24 can be electrically connected with the carrier 20, and the present disclosure is not limited to the above.

Figure 5:
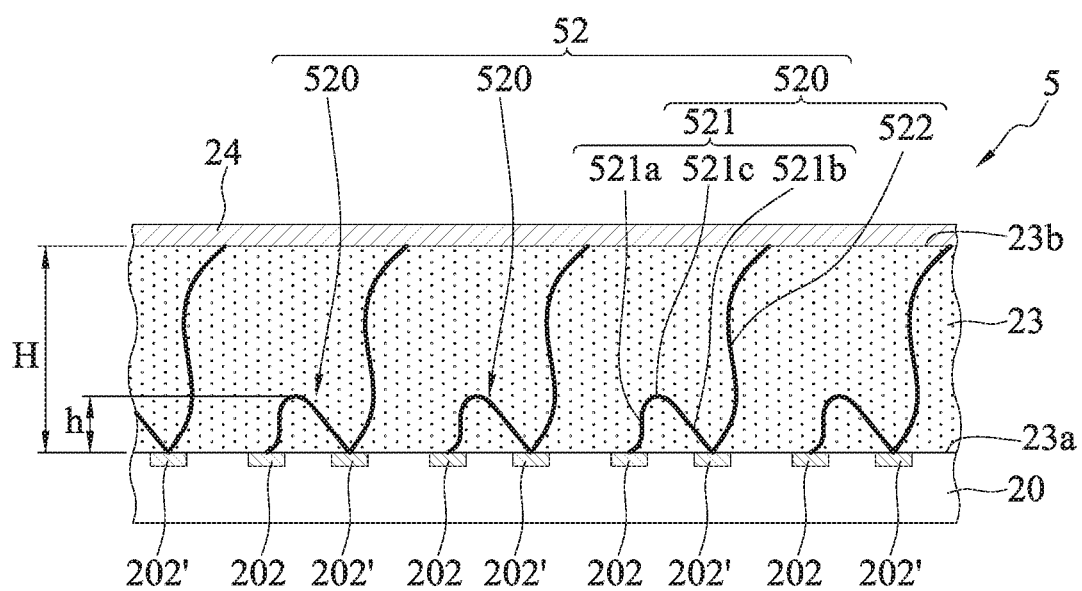
FIG. 5 is a schematic cross-sectional view of an electronic package in accordance with a fifth embodiment of the present disclosure.

FIG. 5 is a partial cross-sectional view of an electronic package 5 in accordance with a fifth embodiment of the present disclosure. This embodiment is different from the previous embodiments in the design of the shielding structure, whereas the rest of the components are the same or similar and will not be repeated hereinafter for conciseness.

As shown in FIG. 5, a shielding structure 52 is formed with bonding wire portions 520 based on the bonding wire portions 220, 320 shown in FIG. 3B or 3C.

In an embodiment, the bonding wire portion 520 includes a first bonding wire 521 and a second bonding wire 522. The height h of the first bonding wire 521 relative to the carrier 20 is lower than the height H of the second bonding wire 522 relative to the carrier 20, such that the first bonding wire 521 is not exposed from the packaging layer 23, whereas the second bonding wire 522 is exposed from the second surface 23b of the packaging layer 23.

Moreover, the two opposite ends of the first bonding wire 521 are respectively bonded onto two function pads 202, 202' to form an arc or a closed arc loop. The first bonding wire 521 is defined with a first line segment 521a of a shorter length, a second line segment 521b of a longer length and a curved segment 521c connected with the first line segment 521a and the second line segment 521b. One end of the second line segment 521b is located correspondingly to the second bonding wire 522.

Furthermore, the second bonding wire 522 is a single line segment that disposes on the first side 20a of the carrier 20. One end of the second bonding wire 522 is bonded onto the function pad 202' to which the second line segment 521b of the first bonding wire 521 is connected, while the other end thereof is exposed from the second surface 23b of the packaging layer 23.

Figure 6:
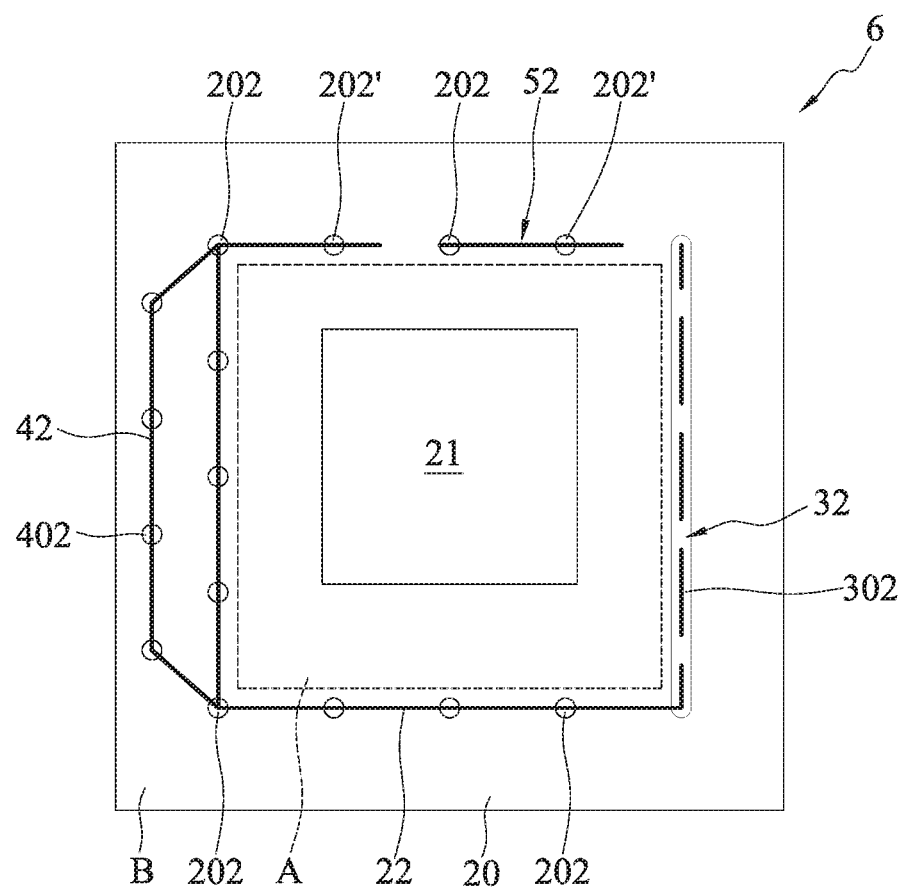
FIG. 6 is a schematic top view of an electronic package in accordance with a sixth embodiment of the present disclosure.

It can be appreciated that, based on the first to the fifth embodiments, different shielding structures 22, 32, 42, 52 can be simultaneously provided around the periphery of the chip placement area A of the carrier 20 (i.e., the periphery area B), as shown in an electronic package 6 in accordance with a sixth embodiment of the present disclosure shown in FIG. 6, and non-continuous wire boning is used between each of the shielding structures 22, 32, 42, 52.

Therefore, the electronic package 2, 2', 3, 4, 5, 6 of the present disclosure employs the bonding wire portions 220, 320, 420, 520 stitch bonded onto the carrier 20 as the shielding structure 22, 32, 42, 52 to prevent influences of temperature, humidity and other environmental factors. Therefore, compared to the prior art, the electronic package 2, 2', 3, 4, 5, 6 of the present disclosure is capable of effectively preventing the shielding structure 22, 32, 42, 52 from peeling off or falling off the carrier 20.

In addition, the shielding structure 22, 32, 42, 52 is encapsulated by the packaging layer 23, so the size and shape of the shielding structure 22, 32, 42, 52 does not have to conform to the size and shape of the packaging layer 23, rendering precision manufacturing process unnecessary. Therefore, compared to the prior art, accuracy in the relative positions between the shielding structure 22, 32, 42, 52 and the packaging layer 23 of the electronic package 2 of the present disclosure is no longer a concern, thereby significantly reducing manufacturing cost and time.

Moreover, since the carrier 20 is already defined with the chip placement area A and the periphery area B, so compared to the prior art, when the electronic package 2, 2', 3, 4, 5, 6 of the present disclosure is provided with an electronic component 21 of a different size and shape, it is not necessary to manufacture another packaging layer 23 of a different size and shape, and in turn, there is no need for making a new mold, thereby further lowering manufacturing cost and time.

The above embodiments are set forth to illustrate the principles of the present disclosure, and should not be interpreted as to limit the present disclosure in any way. The above embodiments can be modified by one of ordinary skill in the art without departing from the scope of the present disclosure as defined in the appended claims.

What is claimed is:

1. An electronic package, comprising:
a carrier;
an electronic component disposed on the carrier;
a shielding structure including a plurality of bonding wire portions, each of the bonding wire portions being provided on the carrier by continuous wire bonding, wherein each of the bonding wire portions has a first bonding wire and a second bonding wire, the first bonding wire is in an arc line shape and one end of the first bonding wire is disposed correspondingly with the second bonding wire, the second bonding wire is a single line segment and disposed on the carrier, a height of the first bonding wire relative to the carrier is lower than a height of the second bonding wire relative to the carrier, and one end of the second bonding wire is in direct contact with the one end of the first bonding wire; and
a packaging layer encapsulating the electronic component and the shielding structure, wherein the other end of the second bonding wire is exposed from the packaging layer.

2. The electronic package of claim 1, wherein the first bonding wire is defined with a first line segment, a second line segment and a curved segment connected with the first line segment and the second line segment.

3. The electronic package of claim 1, further comprising a shielding layer formed on the packaging layer.

4. The electronic package of claim 3, wherein the shielding layer is electrically connected with the carrier.

5. The electronic package of claim 3, wherein the shielding layer is in contact with the other end of the second bonding wire of the shielding structure.

6. The electronic package of claim 3, wherein the shielding layer is not in contact with the shielding structure.

* * * * *